US010692756B1

(12) United States Patent
Xu et al.

(10) Patent No.: US 10,692,756 B1
(45) Date of Patent: Jun. 23, 2020

(54) METHOD FOR FORMING DUAL DAMASCENE INTERCONNECT STRUCTURE

(71) Applicant: Yangtze Memory Technologies Co., Ltd., Wuhan, Hubei Province (CN)

(72) Inventors: Jian Xu, Wuhan (CN); Liang Xiao, Wuhan (CN); Jin Wen Dong, Wuhan (CN); Meng Yan, Wuhan (CN); Li Hong Xiao, Wuhan (CN)

(73) Assignee: Yangtze Memory Technologies Co., Ltd., Wuhan, Hubei Province (CN)

( * ) Notice: Subject to any disclaimer, the term of this patent is extended or adjusted under 35 U.S.C. 154(b) by 0 days.

(21) Appl. No.: 16/286,600

(22) Filed: Feb. 27, 2019

Related U.S. Application Data

(63) Continuation of application No. PCT/CN2019/070118, filed on Jan. 2, 2019.

(51) Int. Cl.
*H01L 21/4763* (2006.01)
*H01L 21/768* (2006.01)
*H01L 21/311* (2006.01)

(52) U.S. Cl.
CPC .. *H01L 21/76808* (2013.01); *H01L 21/31144* (2013.01); *H01L 21/76829* (2013.01)

(58) Field of Classification Search
CPC ......... H01L 21/76808; H01L 21/31144; H01L 21/7682
USPC ........................................................ 438/618
See application file for complete search history.

(56) References Cited

U.S. PATENT DOCUMENTS

| 6,083,822 A * | 7/2000 | Lee ................... H01L 21/76813 257/750 |
| 6,690,091 B1 * | 2/2004 | Chooi ............... H01L 21/31122 257/758 |
| 7,078,350 B2 * | 7/2006 | Kim ................. H01L 21/31144 257/E21.257 |
| 7,176,126 B2 | 2/2007 | Oh |
| 2002/0173160 A1 | 11/2002 | Keil |
| 2002/0192945 A1 | 12/2002 | Nagahara |
| 2003/0024902 A1 | 2/2003 | Li |

(Continued)

FOREIGN PATENT DOCUMENTS

| CN | 1505832 A | 6/2004 |
| CN | 1728358 A | 2/2006 |

(Continued)

*Primary Examiner* — Vu A Vu
(74) *Attorney, Agent, or Firm* — Winston Hsu

(57) ABSTRACT

A method for forming a dual damascene interconnect structure. A substrate having a conductor layer, an etch stop layer on the conductor layer, a dielectric stack on the etch stop layer, and a hard mask layer on the dielectric stack is provided. A photoresist layer having a resist opening is formed on the hard mask layer. The hard mask layer is etched through the resist opening to form a hard mask opening. The dielectric stack is etched through the hard mask opening to form a partial via hole. The photoresist layer is trimmed to form a widened resist opening above the partial via hole. The hard mask layer is etched through the widened resist opening to form a widened hard mask opening above the partial via hole. The dielectric stack is etched through the widened hard mask opening and the partial via hole to form a dual damascene via.

20 Claims, 11 Drawing Sheets

(56) References Cited

U.S. PATENT DOCUMENTS

| | | | |
|---|---|---|---|
| 2003/0190807 A1* | 10/2003 | Soda | H01L 21/31138 |
| | | | 438/689 |
| 2003/0199170 A1 | 10/2003 | Li | |
| 2003/0216052 A1 | 11/2003 | Kakamu | |
| 2004/0115876 A1 | 6/2004 | Goundar | |
| 2007/0287247 A1 | 12/2007 | Liu | |
| 2010/0164121 A1 | 7/2010 | Feustel | |
| 2013/0143408 A1 | 6/2013 | Rantala | |
| 2017/0194229 A1* | 7/2017 | Yi | H01L 23/3192 |

FOREIGN PATENT DOCUMENTS

| | | |
|---|---|---|
| CN | 102362343 A | 2/2012 |
| KR | 10-20050032308 A | 4/2005 |
| KR | 1020050032308 A | 4/2005 |
| KR | 1020060065184 A | 6/2006 |
| KR | 100707652 B1 | 4/2007 |

\* cited by examiner

METHOD FOR FORMING DUAL DAMASCENE INTERCONNECT STRUCTURE

CROSS REFERENCE TO RELATED APPLICATIONS

The present patent document is a continuation of PCT Application Ser. No. PCT/CN2019/070118, filed Jan. 2, 2019, designating the United States, which is hereby incorporated by reference.

BACKGROUND OF THE INVENTION

1. Field of the Invention

The present disclosure generally relates to the field of semiconductor technology and, more particularly, to a method for forming a dual damascene interconnect structure.

2. Description of the Prior Art

As known in the art, three-dimensional (3 D) integration allows for reduction of the system size, both in area and volume. Furthermore, it improves performance since 3 D interconnects are shorter than in a 2 D configuration, enabling a higher operation speed and smaller power consumption. As with other new technologies, a focus on process efficiency is crucial to achieving High Volume Manufacturing (HVM) that meets performance, yield, and cost requirements.

The escalating requirements for high density and performance associated with Ultra Large Scale Integration (ULSI) semiconductor wiring require increasingly sophisticated interconnection technology. As device sizes decrease it has been increasingly difficult to provide interconnection technology that satisfies the requirements of low resistance and capacitance interconnect properties, particularly where submicron inter-layer interconnects and intra-layer interconnects have increasingly high aspect ratios.

FIG. 1 to FIG. 10 are schematic, cross-sectional diagrams showing a prior art method for forming an interface dual damascene via structure. As shown in FIG. 1, a substrate 100 such as a semiconductor substrate is provided. The substrate 100 may comprise a conductor layer 101 such as a metal layer, a metal wire or a metal pad. An etch stop layer 102 and a dielectric stack 110 are formed on the conductor layer 101. For example, the dielectric stack 110 may comprise a lower oxide layer 104, an intermediate dielectric layer 106, and an upper oxide layer 108. For example, the lower oxide layer 104 and the upper oxide layer 108 may be TEOS (abbr. of tetraethoxysilane) oxide layer. For example, the intermediate dielectric layer 106 may be a silicon nitride layer.

A first photoresist layer 120 is then formed on the dielectric stack 110. The first photoresist layer 120 is subjected to a first lithographic process to form an opening 120a in the first photoresist layer 120. The opening 120a exposes a portion of the top surface of the upper oxide layer 108. An additional material layer such as a silicon oxynitride (SiON) layer, a spin-on carbon (SOC) layer or a bottom anti-reflection coating (BARC) layer may be formed between the first photoresist layer 120 and the dielectric stack 110.

As shown in FIG. 2, subsequently, a first dry etching process such as an anisotropic plasma dry etching process is carried out to etch through the dielectric stack 110 through the opening 120a in the first photoresist layer 120. The first dry etching process stops on the etch stop layer 102, thereby forming a first via hole 110a in the dielectric stack 110. The first via hole 110a extends through the upper oxide layer 108, the intermediate dielectric layer 106, and the lower oxide layer 104. The first via hole 110a exposes a portion of the top surface of the etch stop layer 102.

As shown in FIG. 3, subsequently, the remaining first photoresist layer 120 is stripped by using a conventional method such as a plasma ashing process. For example, the remaining first photoresist layer 120 may be stripped by subjecting the substrate 100 in a processing chamber to oxygen-containing plasma or any suitable stripping gas known in the art.

As shown in FIG. 4, after the remaining first photoresist layer 120 is removed, a hard mask layer 130 such as a spin-on carbon (SOC) material layer or a spin-on organic antireflective coating (ARC) layer is then formed on the dielectric stack 110 and in the first via hole 110a.

As shown in FIG. 5, subsequently, a second photoresist layer 140 is then formed on the hard mask layer 130. The second photoresist layer 140 is subjected to a second lithographic process to form an opening 140a in the second photoresist layer 140. The opening 140a exposes a portion of the top surface of the hard mask layer 130. The opening 140a overlaps with the underlying first via hole 110a.

As shown in FIG. 6, subsequently, a hard mask etching process such as an anisotropic plasma dry etching process is carried out to etch the hard mask layer 130 through the opening 140a in the second photoresist layer 140, thereby forming an opening 130a in the hard mask layer 130. The hard mask layer 130 in the upper portion of the first via hole 110a is also removed during the hard mask dry etching process, leaving a small amount of the hard mask layer 130 at the bottom of the first via hole 110a.

As shown in FIG. 7, after the hard mask layer 130 is patterned, a second dry etching process such as an anisotropic plasma dry etching process is carried out to etch the dielectric stack 110 through the opening 130a in the hard mask layer 130, thereby forming a second via hole 110b in the dielectric stack 110 and above the first via hole 110a. The first via hole 110a and the second via hole 110b together constitute an interface dual damascene via 11.

As shown in FIG. 8, after the via pattern of the hard mask layer 130 is transferred to the dielectric stack 110, the remaining hard mask layer 130 is stripped by using a conventional method such as a plasma ashing process. The small amount of the remaining hard mask layer 130 left at the bottom of the first via hole 110a is also removed. After the remaining hard mask layer 130 is stripped, the first via hole 110a is revealed.

As shown in FIG. 9, subsequently, an etching process is performed to etch the exposed etch stop layer 102 through the first via hole 110a, thereby partially exposing the conductor layer 101.

As shown in FIG. 10, a conductor layer 201 such as a metal layer is deposited into the interface dual damascene via 11. The first via hole 110a and the second via hole 110b are filled with the conductor layer 201, thereby forming an interface dual damascene via structure 201a that is electrically connected to the underlying conductor layer 101.

As described above, the prior art method for forming an interface dual damascene structure involves 2-cycle litho-etch and one-step hard mask filling, which results in longer cycle time and higher cost and is undesirable for mass production. Therefore, there is a need in this industry to provide an improved method for forming an interface dual damascene structure that can cope with the above-mentioned prior art shortcomings.

SUMMARY OF THE INVENTION

It is one object of the present disclosure to provide an improved method for forming an interface dual damascene structure to solve the above-mentioned prior art shortcomings and deficiencies.

One aspect of the present disclosure provides a method for forming a dual damascene interconnect structure, comprising: providing a substrate having a conductor layer, an etch stop layer on the conductor layer, a dielectric stack on the etch stop layer, and a hard mask layer on the dielectric stack; forming a photoresist layer having a resist opening on the hard mask layer; etching the hard mask layer through the resist opening to form a hard mask opening in the hard mask layer; etching the dielectric stack through the hard mask opening to form a partial via hole in the dielectric stack; trimming the photoresist layer to form a widened resist opening above the partial via hole; etching the hard mask layer through the widened resist opening to form a widened hard mask opening above the partial via hole; and etching the dielectric stack through the widened hard mask opening and the partial via hole to form a dual damascene via in the dielectric stack. In some embodiments, the trimming process may be performed to trim the hard mask layer.

According to some embodiments, the dielectric stack comprises a lower oxide layer, an intermediate dielectric layer on the lower oxide layer, and an upper oxide layer on the intermediate dielectric layer.

According to some embodiments, the partial via hole extends through the upper oxide layer and the intermediate dielectric layer and exposes a portion of the top surface of the lower oxide layer.

According to some embodiments, the lower oxide layer and the upper oxide layer may comprise a TEOS oxide layer or an HDP oxide layer, and the intermediate dielectric layer may comprise a silicon nitride layer or a nitrogen-doped silicon carbide (SiCN) layer.

According to some embodiments, the dual damascene via comprises a lower via portion in the lower oxide layer and an upper via portion extending through the upper oxide layer, the intermediate dielectric layer, and partially through the lower oxide layer. The lower via portion exposes a portion of the top surface of the etch stop layer.

According to some embodiments, etching the dielectric stack through the widened hard mask opening to form the dual damascene via in the dielectric stack further comprises: etching the etch stop layer through the dual damascene via, thereby partially exposing the conductor layer.

According to some embodiments, the method for forming a dual damascene interconnect structure further comprises: filling the dual damascene via with a filling layer. According to some embodiments, the filling layer comprises copper, aluminum, gold, tungsten, titanium, titanium nitride, silicides, any combinations or alloys thereof.

According to some embodiments, the hard mask layer comprises a spin-on carbon (SOC) material layer or a spin-on organic antireflective coating (ARC) layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
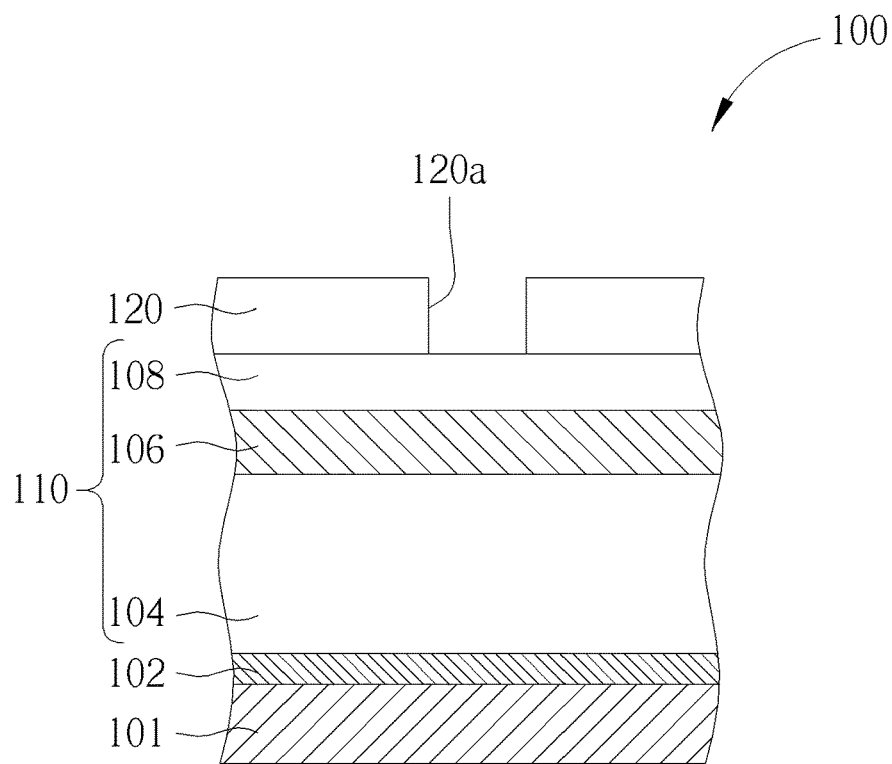
FIG. 1 to FIG. 10 are schematic, cross-sectional diagrams showing a prior art method for forming an interface dual damascene via structure.
Figure 2:
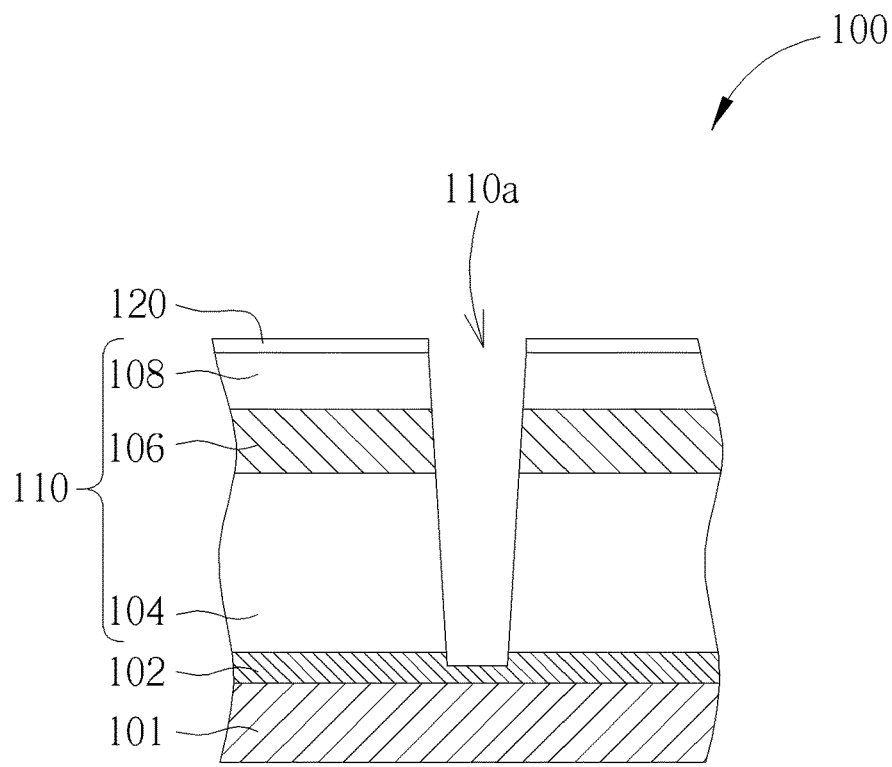
Figure 3:
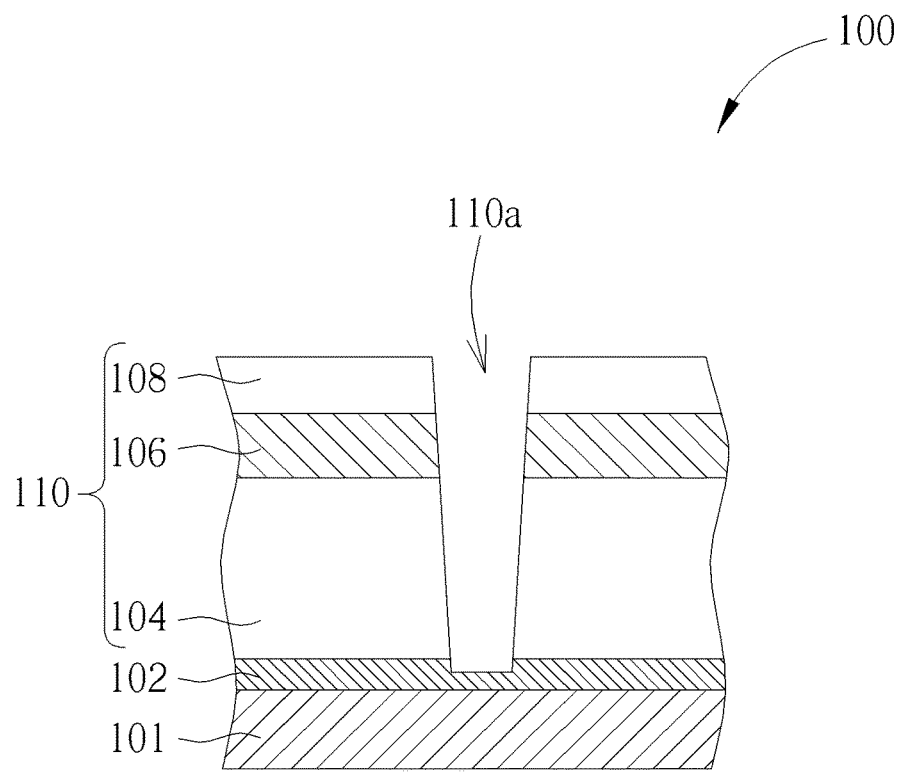
Figure 4:
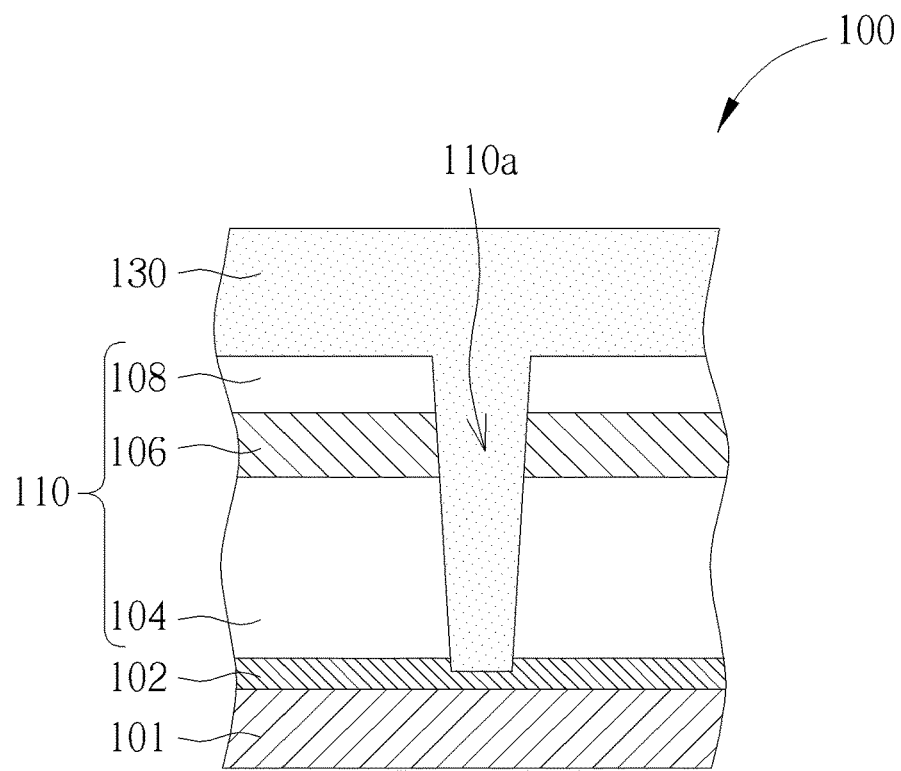
Figure 5:
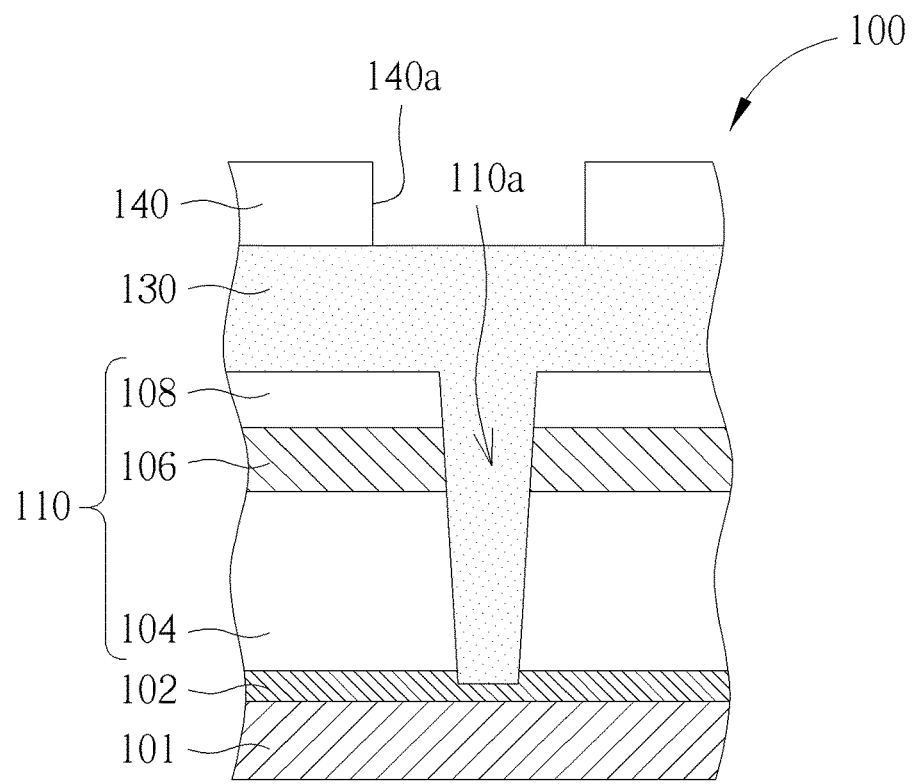
Figure 6:
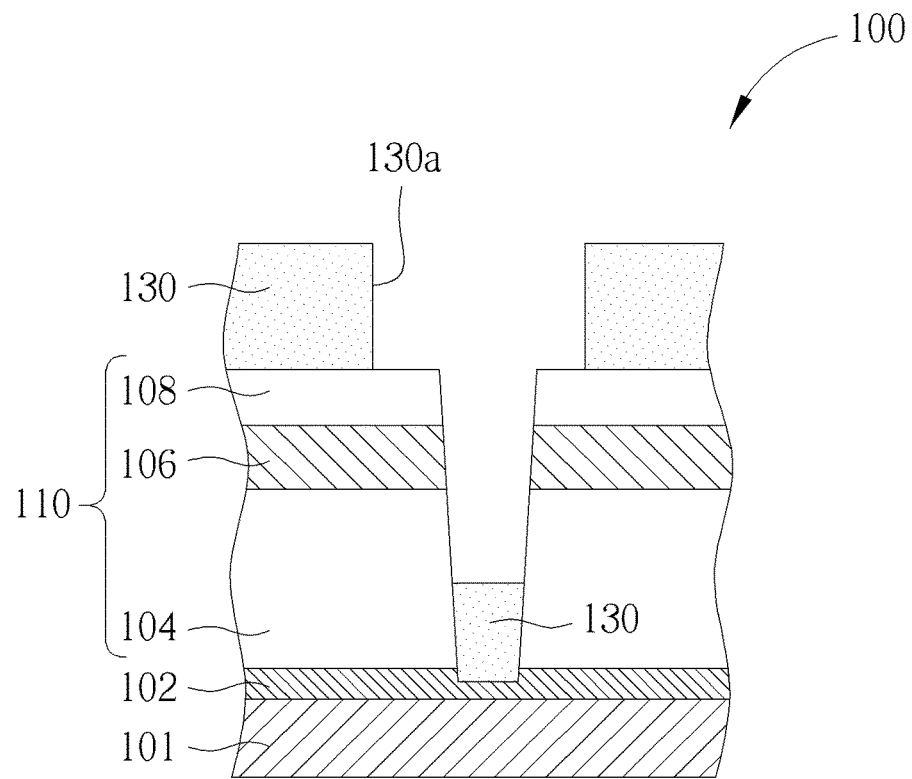
Figure 7:
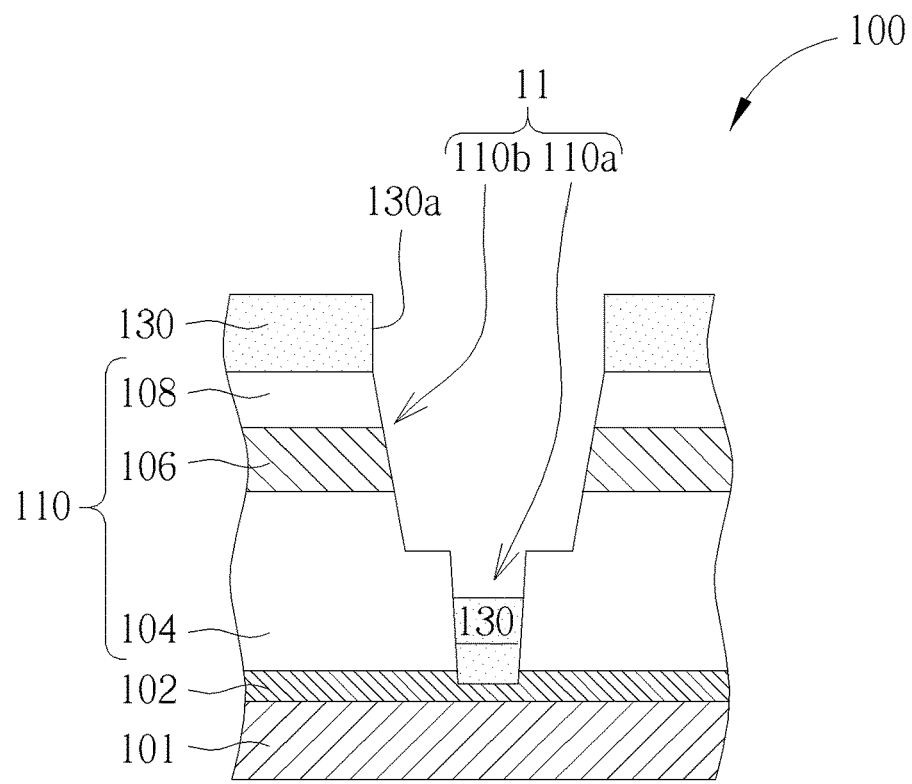
Figure 8:
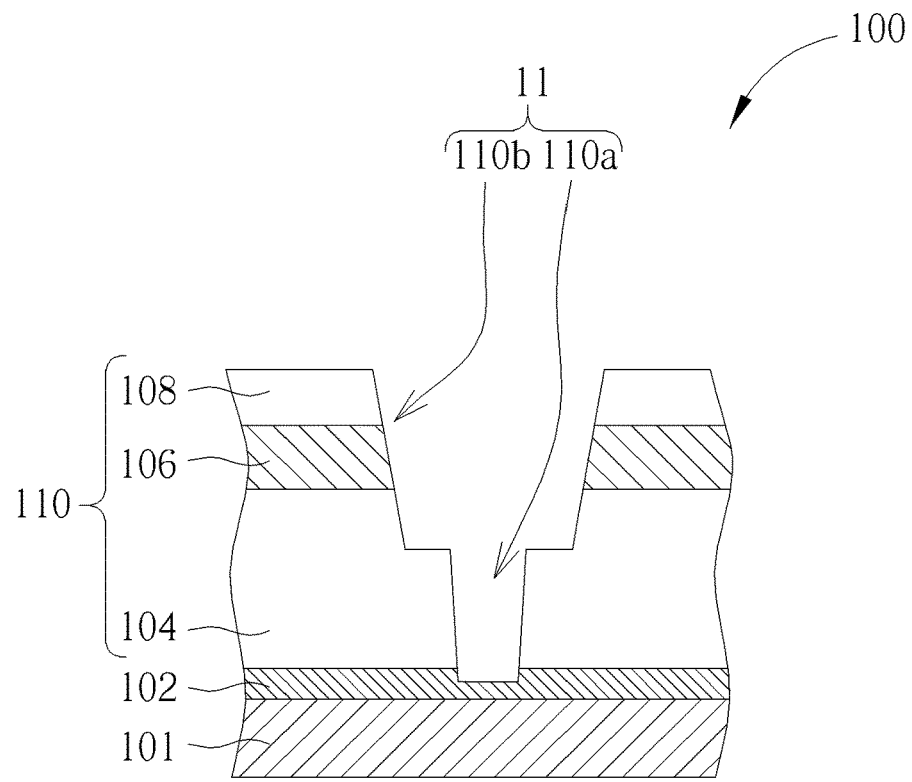
Figure 9:
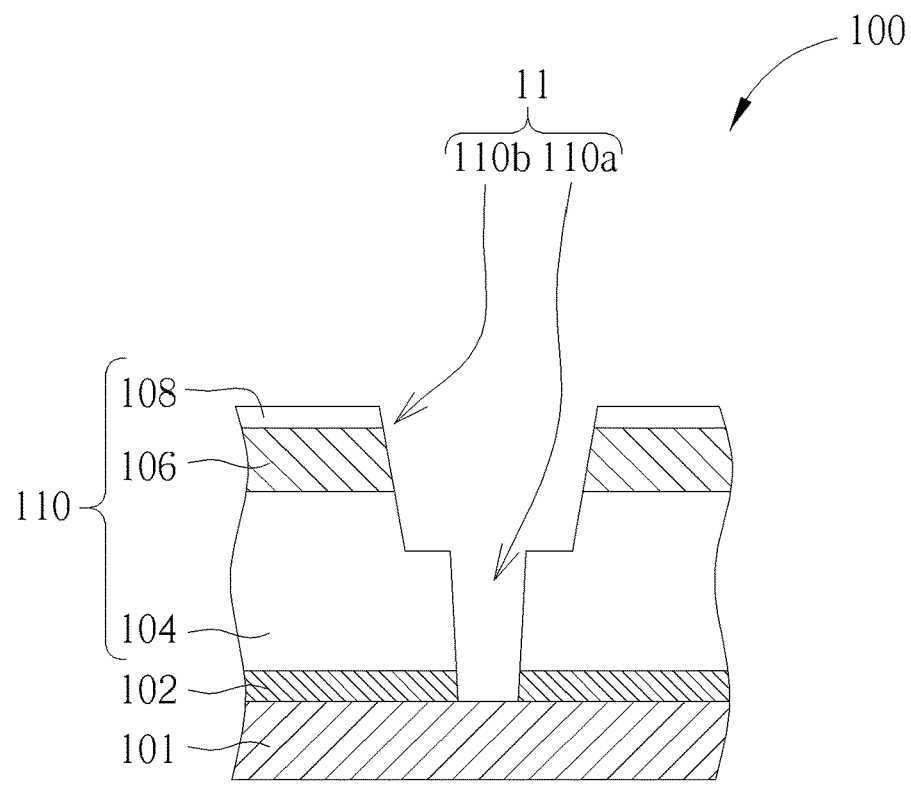
Figure 10:
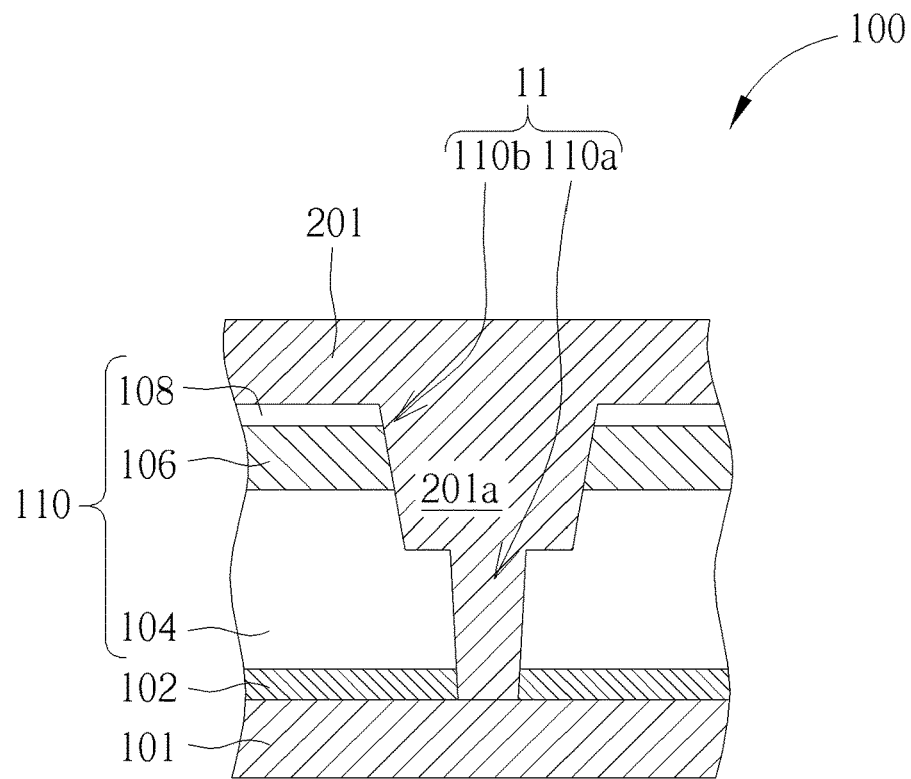

Embodiments of the present disclosure will be described with reference to the accompanying drawings.

DETAILED DESCRIPTION

Reference will now be made in detail to exemplary embodiments of the invention, which are illustrated in the accompanying drawings in order to understand and implement the present disclosure and to realize the technical effect. It can be understood that the following description has been made only by way of example, but not to limit the present disclosure. Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment.

Further, when a particular feature, structure or characteristic is described in contact with an embodiment, it would be within the knowledge of a person skilled in the pertinent art to affect such feature, structure or characteristic in contact with other embodiments whether or not explicitly described.

In general, terminology may be understood at least in part from usage in context . For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something) .

Further, spatially relative terms, such as "beneath," "below," "lower," "above," "upper," and the like, may be used herein for ease of description to describe one element or feature's relationship to another element (s) or feature (s) as illustrated in the figures.

The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or through holes are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value) .

The present invention pertains to an improved method for forming a dual damascene interconnect structure such as an interface dual damascene via structure. Although the embodiments and the drawings herein illustrate an exemplary method for forming an interface dual damascene via structure, it is to understood that the present disclosure may be applicable to the formation of other dual damascene interconnect structures with the benefit of increased via process margin. Further, the method in this disclosure may be applicable to back-end of line (BEOL) via/metal processes.

Figure 11:
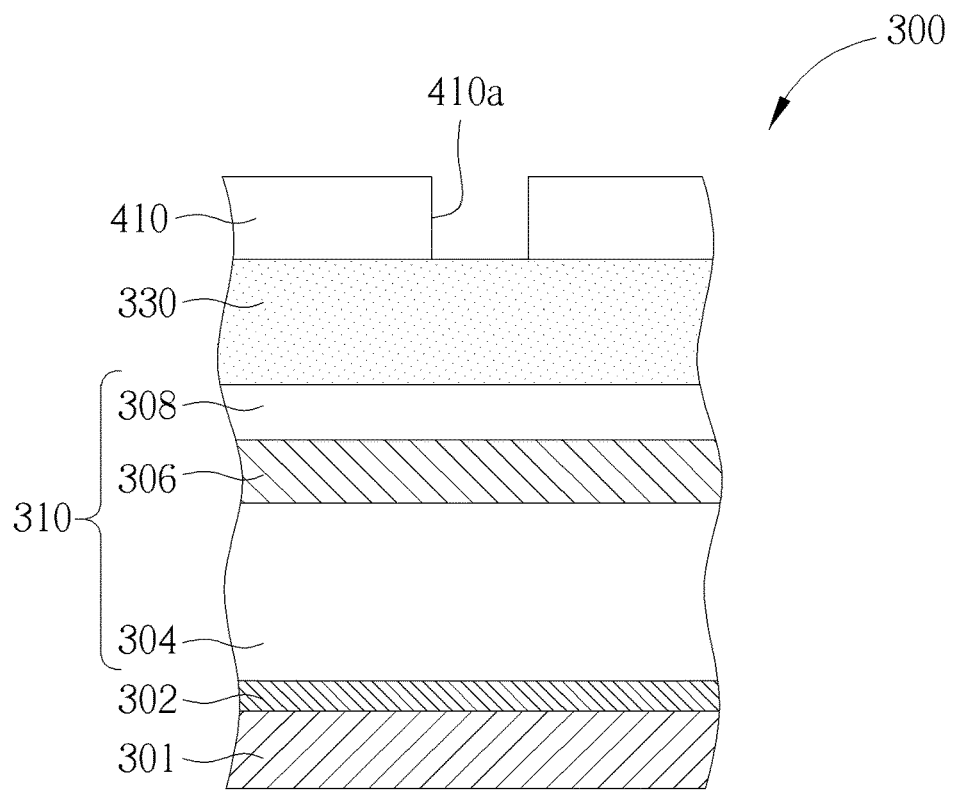
FIG. 11 to FIG. 19 are schematic, cross-sectional diagrams showing a method for forming an interface dual damascene via structure according to one embodiment of the invention.

FIG. 11 to FIG. 19 are schematic, cross-sectional diagrams showing a method for forming an interface dual damascene via structure according to one embodiment of the invention. As shown in FIG. 11, a substrate 300 such as a semiconductor substrate is provided. The semiconductor substrate is defined to mean any construction comprising semiconductor materials, including, but is not limited to, bulk silicon, a semiconductor wafer, a silicon-on-insulator (SOI) substrate, or a silicon germanium substrate. The substrate 300 may comprise a conductor layer 301 such as a metal layer, a metal wire or a metal pad, but is not limited thereto. According to one embodiment, the conductor layer 301 may comprise copper, but is not limited thereto. According to one embodiment, the conductor layer 301 may comprise polysilicon, but is not limited thereto. An etch stop layer 302 and a dielectric stack 310 may be formed on the conductor layer 301. According to one embodiment, the etch stop layer 302 may be deposited directly on the conductor layer 301.

According to one embodiment, the etch stop layer 302 may comprise silicon nitride, silicon oxynitride, silicon carbide, or the like, but is not limited thereto. According to one embodiment, the dielectric stack 310 may comprise a lower oxide layer 304, an intermediate dielectric layer 306 on the lower oxide layer 304, and an upper oxide layer 308 on the intermediate dielectric layer 306. For example, the lower oxide layer 304 and the upper oxide layer 308 may comprise a TEOS (abbr. of tetraethoxysilane) oxide layer or an HDP (high-density plasma) oxide layer. For example, the intermediate dielectric layer 306 may comprise a silicon nitride layer or a nitrogen-doped silicon carbide (SiCN) layer. In some embodiments, the dielectric stack 310 may be an oxide-nitride-oxide stack. In some embodiments, the dielectric stack 310 may comprise only oxide. In some embodiments, the dielectric stack 310 may comprise only nitride. The dielectric stack 310 may comprise other multi-layer stack.

It is to be understood that the dielectric stack 110 may comprise other dielectric materials or layers according to other embodiments. For example, the dielectric materials may comprise silicon dioxide, fluorinated TEOS, carbon-doped oxide, hydrogen silsesquioxane, low-k dielectrics, ultra-low k (k<2.6) dielectrics, etc. For example, the etch stop layer 302 and the dielectric stack 110 may be formed through any of a variety of deposition techniques, including, LPCVD (low-pressure chemical vapor deposition), APCVD (atmospheric-pressure chemical vapor deposition), PECVD (plasma-enhanced chemical vapor deposition), PVD (physical vapor deposition), sputtering, and future-developed deposition procedures.

It is to be understood that the substrate 300 may comprise other layers and/or elements, and these layers and/or elements are not explicitly shown in the figures for the sake of simplicity. For example, the substrate 300 may further comprise inter-layer dielectric (ILD) layers under the conductor layer 301 and/or around the conductor layer 301. For example, metal interconnect structures and/or memory structures may be formed in the inter-layer dielectric layers within other regions of the substrate 300.

According to one embodiment, a hard mask layer 330 such as a spin-on carbon (SOC) material layer or a spin-on organic antireflective coating (ARC) layer is then formed on the dielectric stack 310. According to one embodiment, for example, the aforesaid SOC material layer may have a high carbon content for etch resistance, low film shrinkage, and/or good gap fill properties. A photoresist layer 410 is then formed on the hard mask layer 330. The photoresist layer 410 may be formed by a variety of techniques, e.g. , spin-coating the photoresist on the surface of the substrate 300. For example, the thickness of the first photoresist layer 410 may range between about 1000 and about 20000 angstroms, but is not limited thereto. The photoresist layer 410 is subjected to a lithographic process to form a resist opening 410a in the photoresist layer 410. The resist opening 410a exposes a portion of the top surface of the hard mask layer 330.

Figure 12:
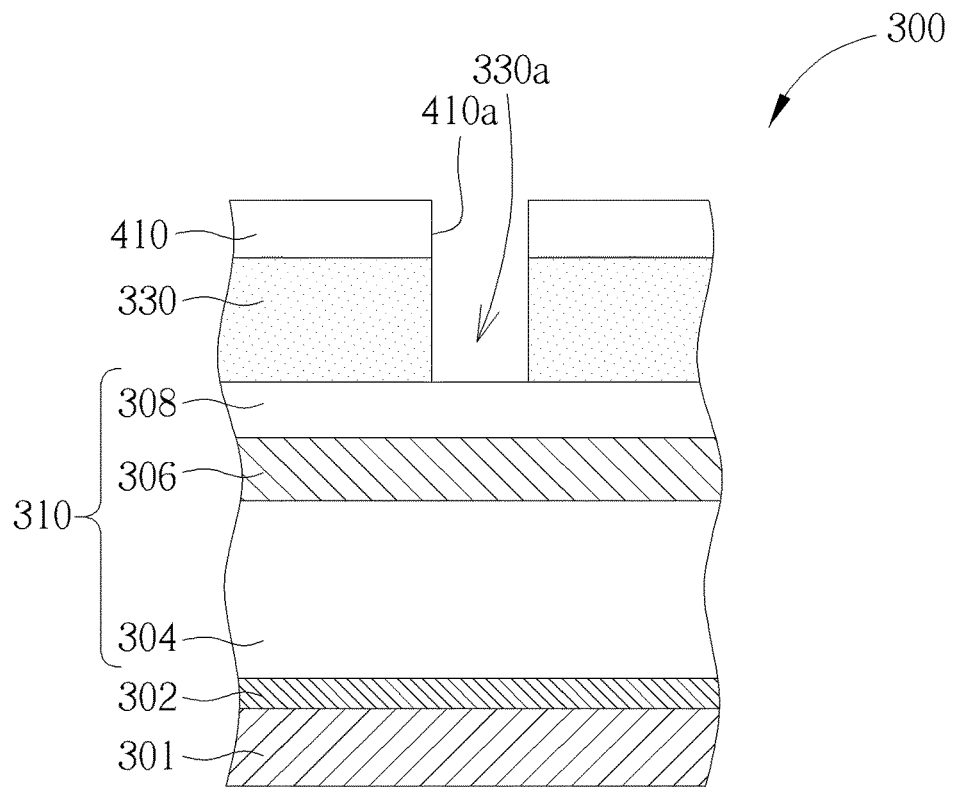

As shown in FIG. 12, subsequently, a first hard mask etching process such as an anisotropic plasma dry etching process is carried out to etch the hard mask layer 330 through the resist opening 410a in the photoresist layer 410. According to one embodiment, the first hard mask etching process may stop on the upper oxide layer 308. A hard mask opening 330a is formed in the hard mask layer 330. The hard mask opening 330a exposes a portion of the top surface of the upper oxide layer 308.

Figure 13:
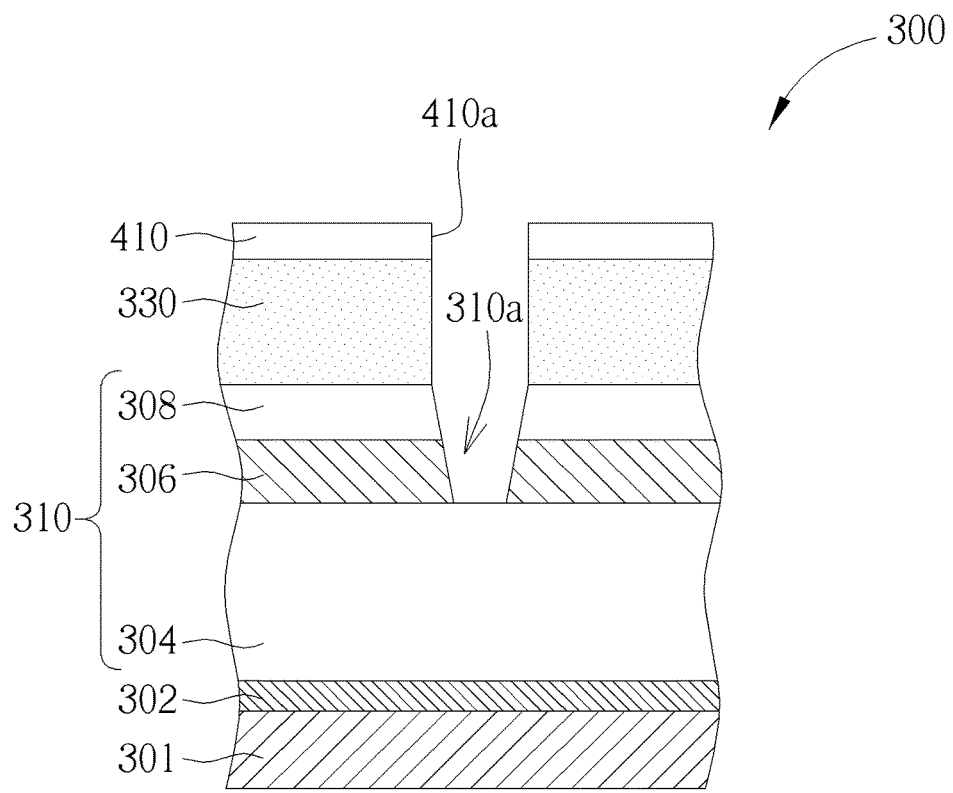

As shown in FIG. 13, after the hard mask layer 330 is patterned, a first dry etching process such as an anisotropic plasma dry etching process is carried out to etch the dielectric stack 310 through the hard mask opening 330a in the hard mask layer 330, thereby forming a partial via hole 310a in the dielectric stack 310. According to one embodiment, the first dry etching process stops on the lower oxide layer 304. That is, the partial via hole 310a extends through the upper oxide layer 308 and the intermediate dielectric layer 306 and exposes a portion of the top surface of the lower oxide layer 304.

Figure 14:
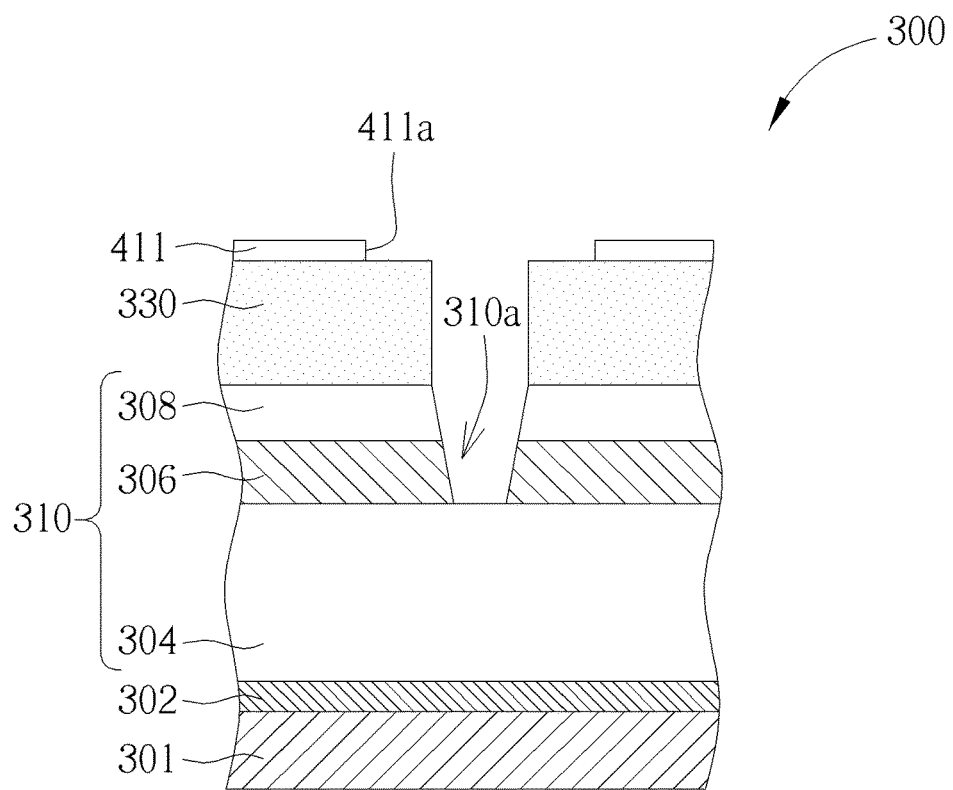

As shown in FIG. 14, after the first dry etching process is completed, the remaining photoresist layer 410 is subjected to a trimming process such as a plasma ashing process so as to form reduced photoresist features 411 and a widened resist opening 411a above the partial via hole 310a. The top surface of the hard mask layer 330 is partially exposed by the widened resist opening 411a. In some embodiments, the trimming process may be performed to trim the hard mask layer.

It is to be understood that the amount and magnitude of the reduction that may be accomplished by the trimming process may be controlled by varying one or more parameters of the trimming process. For example, the trimming gas chemistry, the power supplied during the trimming process, and/or the duration of the trimming process may be varied to affect the amount of the remaining photoresist layer 410 removed in the trimming process.

It should also be noted that, although the reduced photoresist features 411 depicted in FIG. 14 are represented as having very precise and sharp contours, those skilled in the art will recognize that, during the trimming process, these features may become more rounded and contoured in shape. Nevertheless, the result is to produce a reduced photoresist feature 411 that is smaller in size than that as depicted in FIG. 13.

Figure 15:
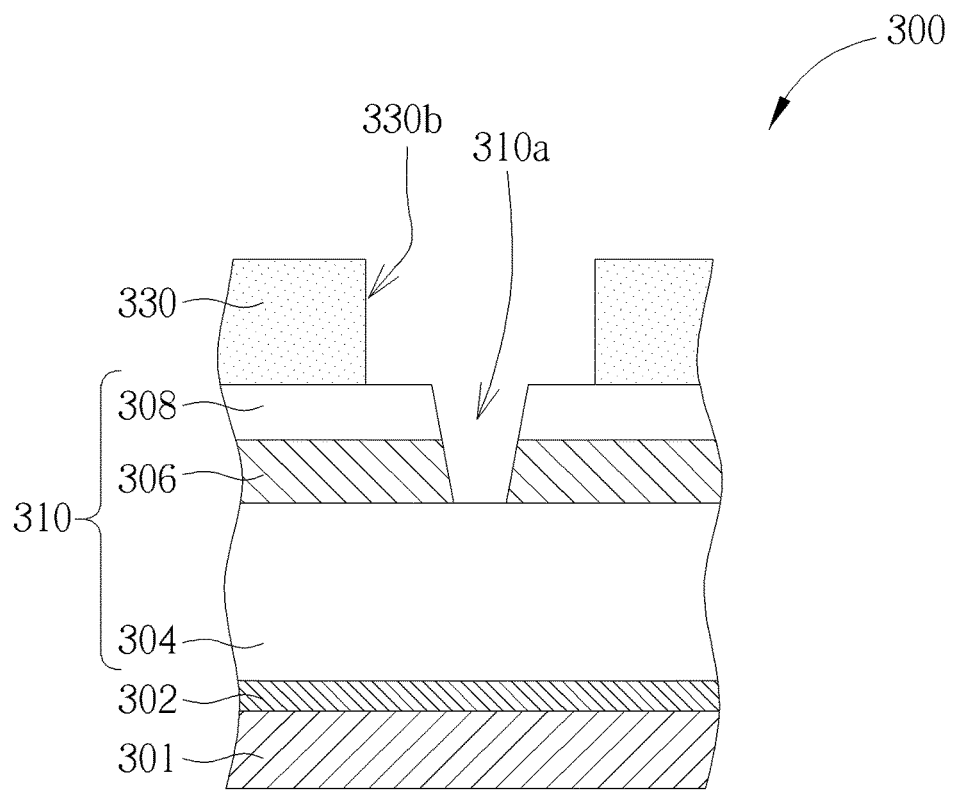

As shown in FIG. 15, after the trimming process is completed, a second hard mask etching process such as an anisotropic plasma dry etching process is carried out to selectively etch the hard mask layer 330 through the widened resist opening 411a of the reduced photoresist features 411, thereby forming a widened hard mask opening 330b in the hard mask layer 330. According to one embodiment, the second hard mask etching process may be a selective etching process. This means that the dielectric stack 310 is substantially not etched during the second hard mask etching process. The widened hard mask opening 330b is located directly above the partial via hole 310a. The widened hard mask opening 330b defines the shape and pattern of an upper portion of a dual damascene via to be formed in the dielectric stack 310.

Figure 20:
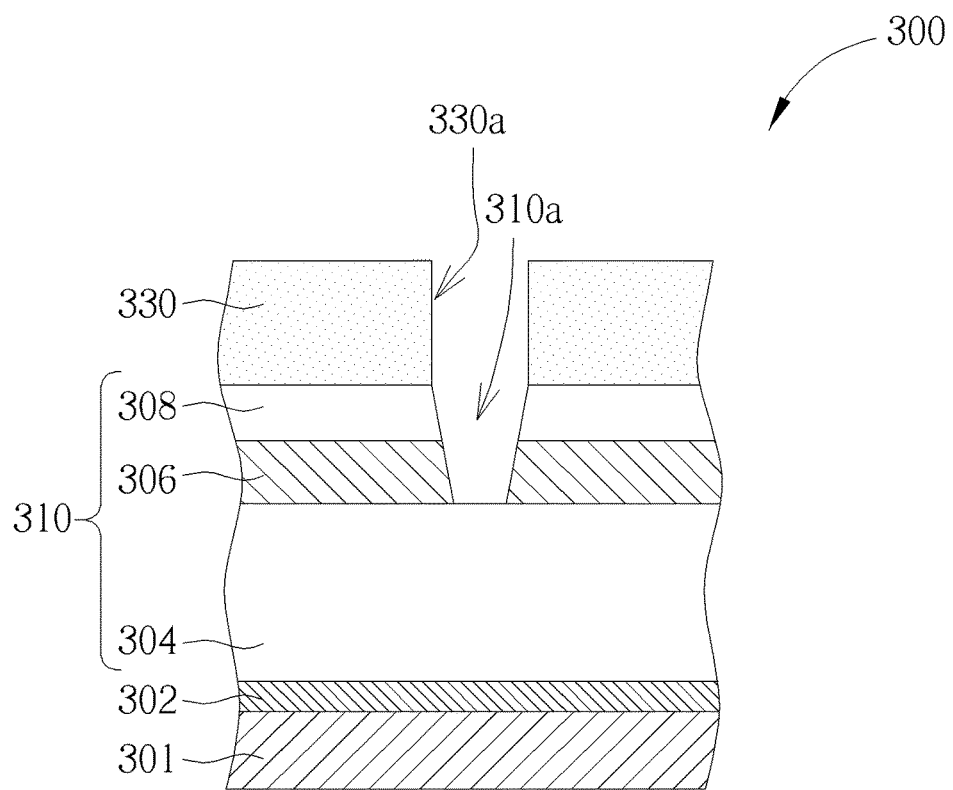
FIG. 20 and FIG. 21 are schematic, cross-sectional diagrams showing a method for forming an interface dual damascene via structure according to another embodiment of the invention.
Figure 21:
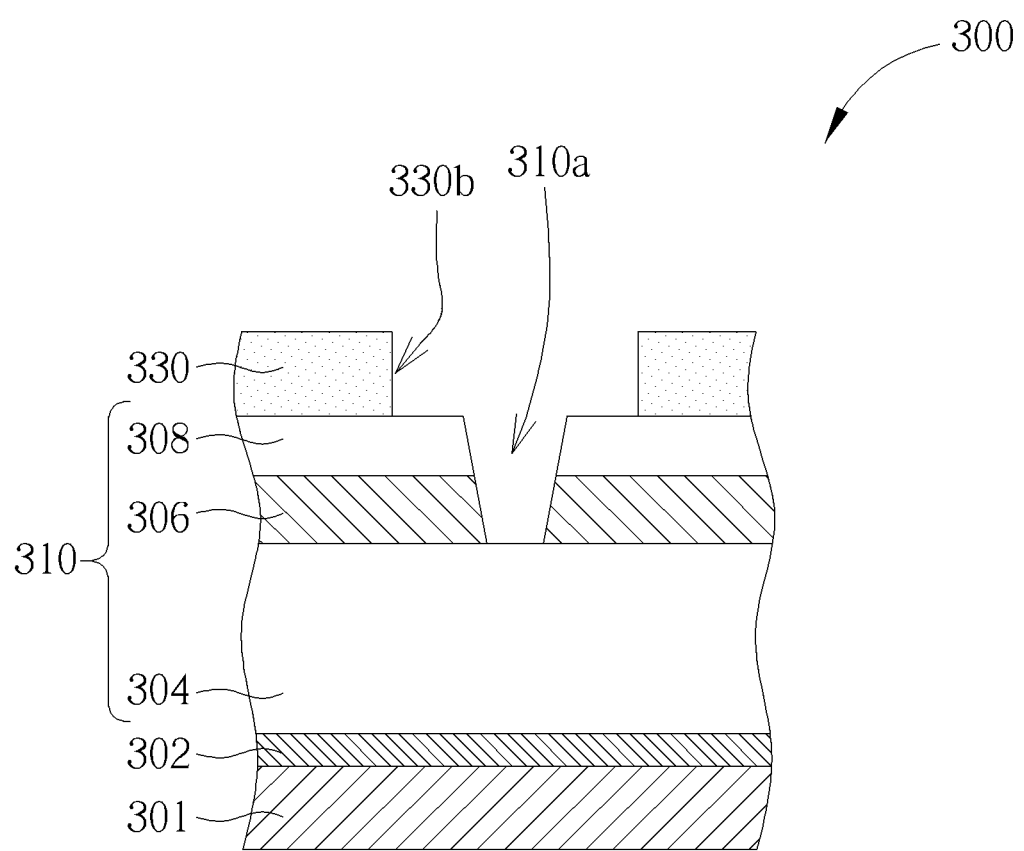

According to another embodiment, as shown in FIG. 20 and FIG. 21, in a case that the photoresist layer 410 is completely consumed during the first dry etching process, the trimming process may be carried out to reduce the size of the remaining hard mask layer 330. After the reduction of the remaining hard mask layer 330, likewise, a widened hard mask opening 330b is formed directly above the partial via hole 310a, as shown in FIG. 21.

Figure 16:
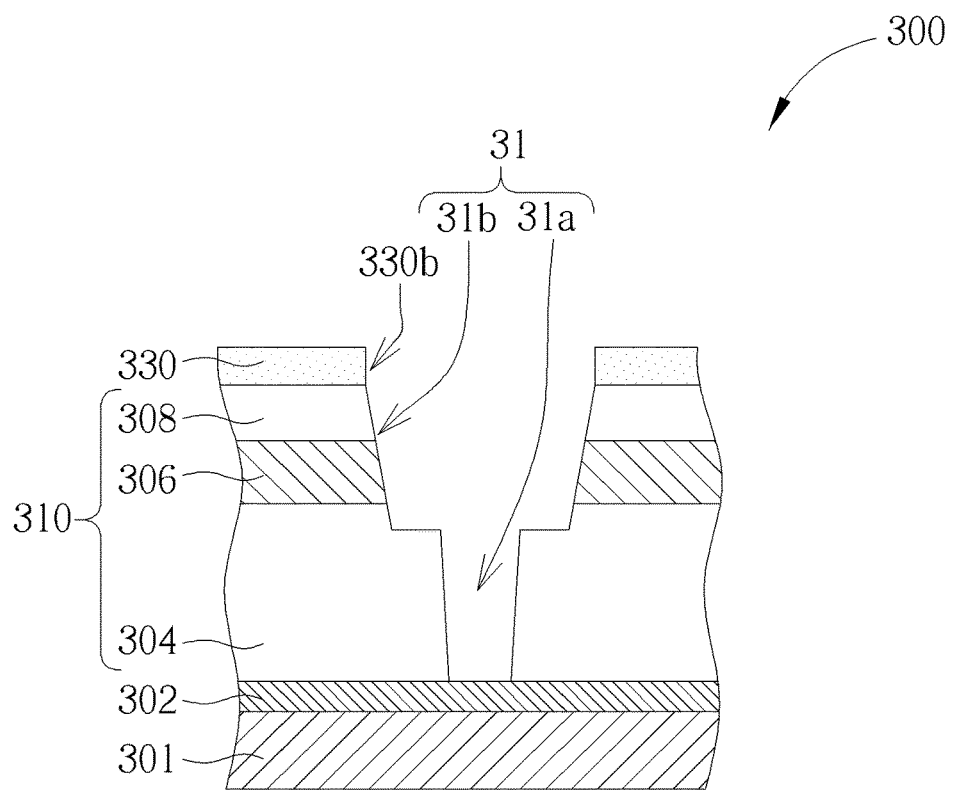

As shown in FIG. 16, a second dry etching process such as an anisotropic plasma dry etching process is carried out to etch the upper oxide layer 308 and the intermediate dielectric layer 306 of the dielectric stack 310 through the widened hard mask opening 330b in the hard mask layer 330 and etch the lower oxide layer 304 through the partial via hole 310a, thereby forming a dual damascene via 31 in the dielectric stack 310.

According to one embodiment, the dual damascene via 31 comprises a lower via portion 31a in the lower oxide layer 304 and an upper via portion 31b extending through the upper oxide layer 308, the intermediate dielectric layer 306, and partially through the lower oxide layer 304. According to one embodiment, the lower via portion 31a exposes a portion of the top surface of the etch stop layer 302. It is to be understood that, in some embodiments, a portion of the exposed etch stop layer 302 may be etched away during the aforesaid second dry etching process. According to one embodiment, the upper via portion 31b may have a dimension (or via hole diameter) that is greater than that of the lower via portion 31a.

Figure 17:
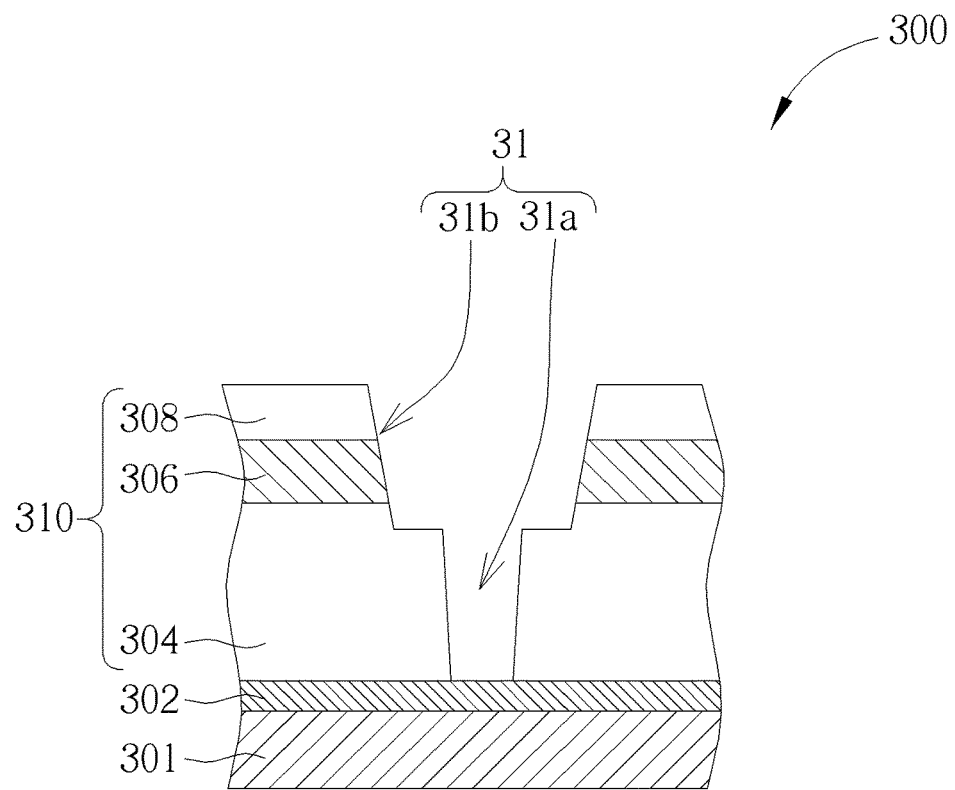

As shown in FIG. 17, after the via pattern of the hard mask layer 330 is transferred to the dielectric stack 310, the remaining hard mask layer 330 is stripped by using a conventional method such as a plasma ashing process. After the remaining hard mask layer 330 is stripped, the top surface of the upper oxide layer 308 is revealed.

Figure 18:
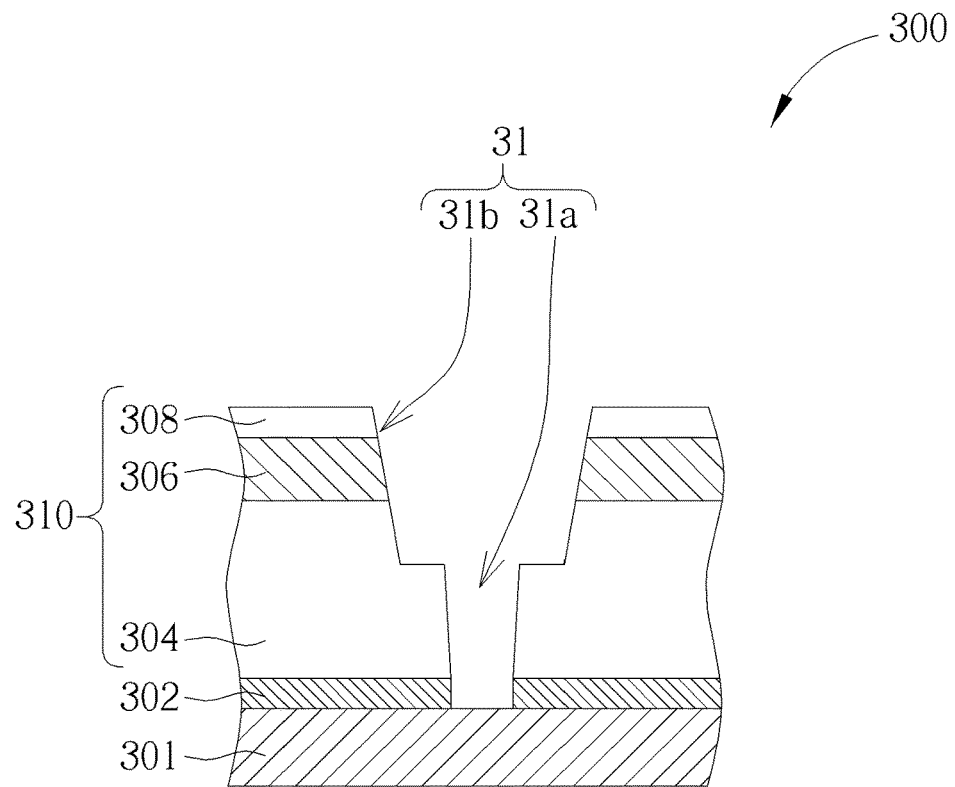

As shown in FIG. 18, subsequently, an etching process such as a wet etching process or a dry etching process may be performed to etch the exposed etch stop layer 302 through the dual damascene via 31, thereby partially exposing the conductor layer 301. According to one embodiment, during the etching process to open the etch stop layer 302, a portion of the upper oxide layer 308 and a portion of the lower oxide layer 304 may be consumed.

Figure 19:
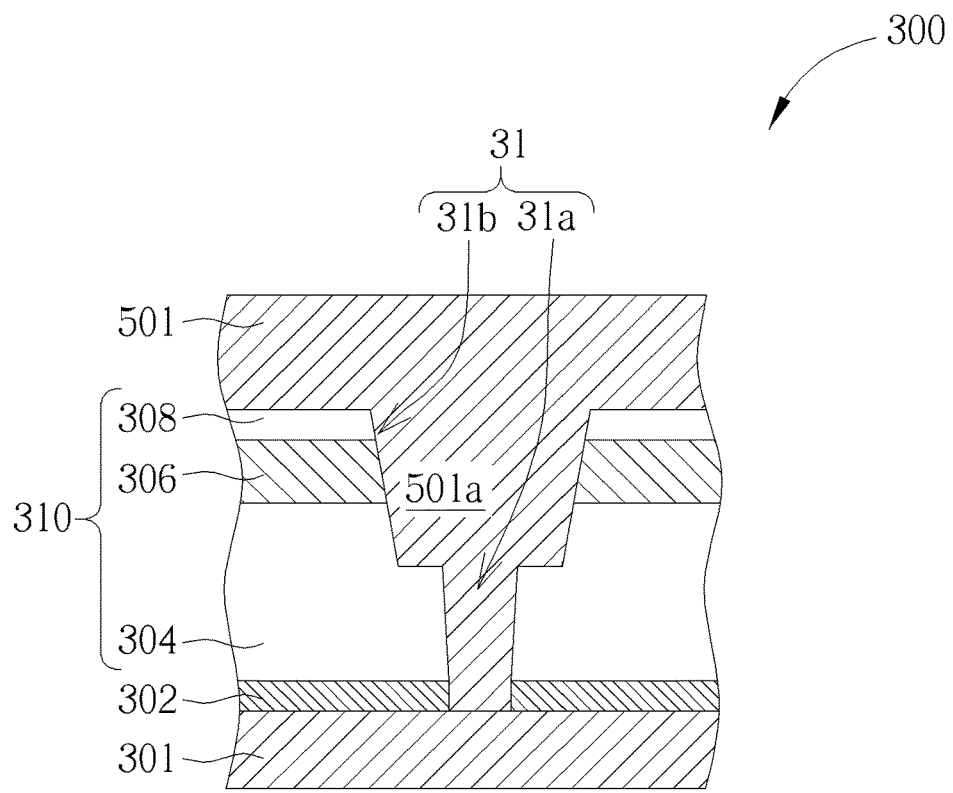

As shown in FIG. 19, a filling layer 501 such as a metal layer is deposited into the dual damascene via 31. The lower via portion 31a and the upper via portion 31b are filled with the filling layer 501, thereby forming an interface dual damascene via structure 501a that is electrically connected to the underlying conductor layer 301. According to one embodiment, the filling layer 501 may comprise copper, aluminum, gold, tungsten, titanium, titanium nitride, silicides, any combinations or alloys thereof. According to one embodiment, the filling layer 501 may comprise a copper layer and a diffusion barrier layer (not shown), but is not limited thereto. Although not shown in the figures, according to some embodiments, a subsequent polishing process such as a chemical mechanical polishing process may be performed to remove excess filling layer 501 outside the interface dual damascene via 31.

It is advantageous to use the disclosed method because by using the resist/hard mask trimming process to replace the prior art 2-cycle litho-etch approach, the manufacturing process for forming the interface dual damascene via structure becomes more efficient. The process time and the cost are both reduced because one photo mask may be spared. The present disclosure also provides the benefit of increased via process margin when actualized this method to the minimum design CD (critical dimension) of M1 as bit-line in 3 D-NAND processes. The method in this disclosure may also be applicable to back-end of line (BEOL) via/metal processes.

Accordingly, one aspect of the present disclosure provides a method for forming a dual damascene interconnect structure, comprising: providing a substrate having a conductor layer, an etch stop layer on the conductor layer, a dielectric stack on the etch stop layer, and a hard mask layer on the dielectric stack; forming a photoresist layer having a resist opening on the hard mask layer; etching the hard mask layer through the resist opening to form a hard mask opening in the hard mask layer; etching the dielectric stack through the hard mask opening to form a partial via hole in the dielectric stack; trimming the photoresist layer to form a widened resist opening above the partial via hole; etching the hard mask layer through the widened resist opening to form a widened hard mask opening above the partial via hole; and etching the dielectric stack through the widened hard mask opening and the partial via hole to form a dual damascene via in the dielectric stack.

According to some embodiments, the dielectric stack comprises a lower oxide layer, an intermediate dielectric layer on the lower oxide layer, and an upper oxide layer on the intermediate dielectric layer.

According to some embodiments, the partial via hole extends through the upper oxide layer and the intermediate dielectric layer and exposes a portion of the top surface of the lower oxide layer.

According to some embodiments, the lower oxide layer and the upper oxide layer may comprise a TEOS oxide layer or an HDP oxide layer, and the intermediate dielectric layer may comprise a silicon nitride layer or a nitrogen-doped silicon carbide (SiCN) layer.

According to some embodiments, the dual damascene via comprises a lower via portion in the lower oxide layer and an upper via portion extending through the upper oxide layer, the intermediate dielectric layer, and partially through the lower oxide layer. The lower via portion exposes a portion of the top surface of the etch stop layer.

According to some embodiments, etching the dielectric stack through the widened hard mask opening to form the dual damascene via in the dielectric stack further comprises: etching the etch stop layer through the dual damascene via, thereby partially exposing the conductor layer.

According to some embodiments, the method for forming a dual damascene interconnect structure further comprising: filling the dual damascene via with a filling layer. According to some embodiments, the filling layer comprises copper, aluminum, gold, tungsten, titanium, titanium nitride, silicides, any combinations or alloys thereof.

According to some embodiments, the hard mask layer comprises a spin-on carbon (SOC) material layer or a spin-on organic antireflective coating (ARC) layer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a dual damascene interconnect structure, comprising:
providing a substrate having a conductor layer, an etch stop layer on the conductor layer, a dielectric stack on the etch stop layer, and a hard mask layer on the dielectric stack;
forming a photoresist layer having a resist opening on the hard mask layer;
etching the hard mask layer through the resist opening to form a hard mask opening in the hard mask layer;
etching the dielectric stack through the hard mask opening to form a partial via hole in the dielectric stack;
trimming the photoresist layer to form a trimmed photoresist layer on the hard mask layer and a widened resist opening above the partial via hole;
using the trimmed photoresist layer as an etching mask and selectively etching the hard mask layer through the widened resist opening, without etching the dielectric stack, to form a widened hard mask opening above the partial via hole; and
using the etched hard mask layer as an etching mask and etching the dielectric stack through the widened hard mask opening and the partial via hole to form a dual damascene via in the dielectric stack.

2. The method for forming a dual damascene interconnect structure according to claim 1, wherein the dielectric stack comprises a lower oxide layer, an intermediate dielectric layer on the lower oxide layer, and an upper oxide layer on the intermediate dielectric layer.

3. The method for forming a dual damascene interconnect structure according to claim 2, wherein the partial via hole extends through the upper oxide layer and the intermediate dielectric layer and exposes a portion of the top surface of the lower oxide layer.

4. The method for forming a dual damascene interconnect structure according to claim 2, wherein the lower oxide layer and the upper oxide layer comprise a TEOS oxide layer or an HDP oxide layer, and wherein the intermediate dielectric layer comprises a silicon nitride layer or a nitrogen-doped silicon carbide (SiCN) layer.

5. The method for forming a dual damascene interconnect structure according to claim 2, wherein the dual damascene via comprises a lower via portion in the lower oxide layer and an upper via portion extending through the upper oxide layer, the intermediate dielectric layer, and partially through the lower oxide layer.

6. The method for forming a dual damascene interconnect structure according to claim 5, wherein the lower via portion exposes a portion of the top surface of the etch stop layer.

7. The method for forming a dual damascene interconnect structure according to claim 1, wherein said etching the dielectric stack through the widened hard mask opening to form the dual damascene via in the dielectric stack further comprises:
etching the etch stop layer through the dual damascene via, thereby partially exposing the conductor layer.

8. The method for forming a dual damascene interconnect structure according to claim 7 further comprising:
filling the dual damascene via with a filling layer.

9. The method for forming a dual damascene interconnect structure according to claim 8, wherein the filling layer comprises copper, aluminum, gold, tungsten, titanium, titanium nitride, silicides, any combinations or alloys thereof.

10. The method for forming a dual damascene interconnect structure according to claim 1, wherein the hard mask layer comprises a spin-on carbon (SOC) material layer or a spin-on organic antireflective coating (ARC) layer.

11. A method for forming a dual damascene interconnect structure, comprising:
providing a substrate having a conductor layer, an etch stop layer on the conductor layer, a dielectric stack on the etch stop layer, and a hard mask layer on the dielectric stack;

forming a photoresist layer having a resist opening on the hard mask layer;

etching the hard mask layer through the resist opening to form a hard mask opening in the hard mask layer;

etching the dielectric stack through the hard mask opening to form a partial via hole in the dielectric stack, wherein the photoresist layer is completely consumed after etching the dielectric stack;

trimming the hard mask layer, without etching the dielectric stack, to form a widened hard mask opening above the partial via hole; and etching the dielectric stack through the widened hard mask opening and the partial via hole to form a dual damascene via in the dielectric stack.

12. The method for forming a dual damascene interconnect structure according to claim 11, wherein the dielectric stack comprises a lower oxide layer, an intermediate dielectric layer on the lower oxide layer, and an upper oxide layer on the intermediate dielectric layer.

13. The method for forming a dual damascene interconnect structure according to claim 12, wherein the partial via hole extends through the upper oxide layer and the intermediate dielectric layer and exposes a portion of the top surface of the lower oxide layer.

14. The method for forming a dual damascene interconnect structure according to claim 12, wherein the lower oxide layer and the upper oxide layer comprise a TEOS oxide layer or an HDP oxide layer, and wherein the intermediate dielectric layer comprises a silicon nitride layer or a nitrogen-doped silicon carbide (SiCN) layer.

15. The method for forming a dual damascene interconnect structure according to claim 12, wherein the dual damascene via comprises a lower via portion in the lower oxide layer and an upper via portion extending through the upper oxide layer, the intermediate dielectric layer, and partially through the lower oxide layer.

16. The method for forming a dual damascene interconnect structure according to claim 15, wherein the lower via portion exposes a portion of the top surface of the etch stop layer.

17. The method for forming a dual damascene interconnect structure according to claim 11, wherein said etching the dielectric stack through the widened hard mask opening to form the dual damascene via in the dielectric stack further comprises:

etching the etch stop layer through the dual damascene via, thereby partially exposing the conductor layer.

18. The method for forming a dual damascene interconnect structure according to claim 17 further comprising:

filling the dual damascene via with a filling layer.

19. The method for forming a dual damascene interconnect structure according to claim 18, wherein the filling layer comprises copper, aluminum, gold, tungsten, titanium, titanium nitride, silicides, any combinations or alloys thereof.

20. The method for forming a dual damascene interconnect structure according to claim 11, wherein the hard mask layer comprises a spin-on carbon (SOC) material layer or a spin-on organic antireflective coating (ARC) layer.

* * * * *